(12) United States Patent
Smith

(10) Patent No.: US 10,079,042 B2
(45) Date of Patent: Sep. 18, 2018

(54) THERMALLY CONDUCTIVE AND VIBRATION DAMPING ELECTRONIC DEVICE ENCLOSURE AND MOUNTING

(71) Applicant: David Lane Smith, Montgomery, TX (US)

(72) Inventor: David Lane Smith, Montgomery, TX (US)

( * ) Notice: Subject to any disclaimer, the term of this patent is extended or adjusted under 35 U.S.C. 154(b) by 0 days.

(21) Appl. No.: 15/795,776

(22) Filed: Oct. 27, 2017

(65) Prior Publication Data

US 2018/0053533 A1 Feb. 22, 2018

Related U.S. Application Data

(63) Continuation-in-part of application No. 14/986,683, filed on Jan. 2, 2016, now Pat. No. 9,804,644.

(60) Provisional application No. 62/099,194, filed on Jan. 1, 2015.

(51) Int. Cl.
| | |
|---|---|
| *G06F 1/16* | (2006.01) |
| *H05K 5/00* | (2006.01) |
| *H05K 7/00* | (2006.01) |
| *G11B 33/14* | (2006.01) |
| *G11B 33/08* | (2006.01) |
| *G06F 1/20* | (2006.01) |
| *H05K 7/20* | (2006.01) |

(52) U.S. Cl.
CPC ............ *G11B 33/1426* (2013.01); *G06F 1/20* (2013.01); *G11B 33/08* (2013.01); *H05K 7/2039* (2013.01)

(58) Field of Classification Search
CPC ...... H05K 1/0271; H05K 7/2039; G06F 1/20; G06F 1/203; G06F 1/206; G06F 1/18–1/189
USPC .... 361/679.33–679.36, 679.46, 679.54, 704, 361/707, 708, 709, 714
See application file for complete search history.

(56) References Cited

U.S. PATENT DOCUMENTS

| | | | | |
|---|---|---|---|---|
| 6,005,768 A | * | 12/1999 | Jo | G11B 33/08 248/638 |
| 6,320,744 B1 | * | 11/2001 | Sullivan | G06F 1/184 312/223.2 |
| 6,496,362 B2 | * | 12/2002 | Osterhout | G11B 33/08 206/586 |
| 7,518,859 B2 | * | 4/2009 | Kobayashi | G11B 33/08 361/518 |
| 9,165,607 B2 | * | 10/2015 | Tan | F16F 1/371 |
| 2005/0168935 A1 | * | 8/2005 | Inoue | G06F 1/184 361/679.34 |
| 2008/0030945 A1 | * | 2/2008 | Mojaver | G06F 1/181 361/679.33 |
| 2009/0279246 A1 | * | 11/2009 | Nguyen | G06F 1/187 361/679.34 |
| 2011/0102998 A1 | * | 5/2011 | Lin | G06F 1/187 361/679.33 |

* cited by examiner

*Primary Examiner* — Anthony Haughton

(57) ABSTRACT

A system and method for heat dissipation and vibration damping of electronic devices in which an assembly is formed by one or more surfaces comprised of at least one material that is a thermally conductive plastic that combines to partially or completely enclose one or more electronic devices as a physical and thermal intermediary between the electronic devices and supporting structures.

16 Claims, 6 Drawing Sheets

THERMALLY CONDUCTIVE AND VIBRATION DAMPING ELECTRONIC DEVICE ENCLOSURE AND MOUNTING

RELATED APPLICATION

This application is a continuation-in-part of U.S. patent application Ser. No. 14/986,683, filed on Jan. 2, 2016 and entitled "THERMALLY CONDUCTIVE AND VIBRATION DAMPING ELECTRONIC DEVICE ENCLOSURE AND MOUNTING", now issued as U.S. Pat. No. 9,804,644, issued on Oct. 31, 2017, which claims the priority of U.S. Provisional 62/099,194, filed on Jan. 1, 2015 and entitled "APPARATUS AND METHOD FOR USING THERMALLY CONDUCTIVE PLASTIC FOR ELECTRONIC DEVICE ENCLOSURE AND MOUNTING" all of which is hereby incorporated by reference in its entirety.

TECHNICAL FIELD

This disclosure relates to a system and method for heat dissipation and vibration damping of electronic devices by installing the electronic devices in a thermally conductive plastic assembly that provides for thermal conduction and vibration damping of an electronic device.

BACKGROUND

The heat generated by the internal components of electronic devices has long been a significant factor determining the design of microelectronic systems. Semiconductors typically have a threshold temperature above which their performance is severely degraded, thus the internal cooling of electronic equipment has been a parameter of great interest to designers and manufacturers. Some common forms of heat dissipation in early electronics designs were liquid to gas phase change of a fluid in direct contact with the heat-generating device (Camp, in U.S. Pat. No. 2,883,591; April 1959), metal-to-metal contact heat conduction away from the heat-generating components (Deakin, in U.S. Pat. No. 2,917,286; December 1959), a heat sink in direct thermal contact with the mechanical structure of the device (Potter, et al. in U.S. Pat. No. 3,196,317; July 1965), and solid to liquid phase change of a substance in thermal contact with the heat-generating device (Haumesser, et al. in U.S. Pat. No. 3,328,642; June 1967).

The most common forms of heat dissipation in early personal computer designs involved direct physical contact between heat-generating integrated circuits and a heat-conducting heat sink mass such as aluminum, and non-turbulent airflow, typically generated by electrical fans, to circulate cool air through a space interior to the computer system housing. In the early large-scale computing systems of the 1940s and 1950s, heat dissipation consisted primarily of ventilation apertures in housings, followed by ambient-air fans and blowers which cooled by forced air convection.

Zelina, in U.S. Pat. No. 3,566,958 (1971), describes a means of thermally coupling heat conductors to integrated circuit chips, though without addressing how to transport the heat contained in the heat-conducting material away from the space surrounding the electrical device. In U.S. Pat. No. 3,648,113 (1972) Rathjen describes a means of stacking planar electronic devices, with spacing between the flat planes, and cooling the entire assembly using fluid flow across the flat surfaces; the cooling fluid exits the entire assembly, thereby transporting heat away from the heat-generating electronics. Schuler discloses an electronics system casing with good thermal conduction properties in U.S. Pat. No. 3,699,394 (1972); the case was presumed to be of metallic composition, though possibly sealed or bonded with thermally conductive epoxy. Austin, in U.S. Pat. No. 3,737,728 (1973) discloses a mounting structure for fragile heat-generating devices (e.g. devices used in computer apparatuses), as well as uniformity of heat conduction and good heat dissipation away from the core assembly area. These ideas are combined in U.S. Pat. No. 3,865,183 (1975), in which Roush describes a more comprehensive means of constructing a full computer assembly with good heat dissipation characteristics of the individual circuit boards in the module, with fluid flow for removal of heat energy from the assembly.

As demand for ruggedized portable electronic devices increased, engineers began to incorporate shock and vibration damping features into electronic system designs. Damping of vibration and shock forces is particularly important for hard disk drives (magnetic spinning platter disk drives) which are susceptible to externally generated vibrations and shocks that may cause a read head to make physical contact with a spinning surface, thereby rendering unreadable the information contained in that physical portion of the platter surface. Damping of internally generated kinetic forces that result in vibration is important for reliable operation of hard disk drives and collections of hard disk drives that are mounted in the same enclosure.

U.S. Pat. No. 4,382,587 (Heinrich, et al, May 1983) disclose a means for vibration damping for an electronic component and system designs. U.S. Pat. No. 6,618,246 (Sullivan et al., September 2003) disclose a design that incorporates thermal conduction and shock resistance in distinctive features for an electronic unit. U.S. Pat. No. 8,050,028 (Merz et al., November 2011) disclose a design that incorporates thermal conduction and shock resistance in distinctive features for a computing device. U.S. Pat. No. 8,199,506 (Janik et al., June 2012) disclose a design for thermal conduction and shock resistance for a solid state data storage assembly. U.S. Pat. No. 8,913,390 (Malek et al., December 2014) disclose a design for thermal conduction and shock resistance at the edge surface of a printed circuit board. U.S. Pat. No. 6,151,216 (Vos et al., November 2000) disclose a design that incorporates thermal conduction and shock and vibration resistance in the same feature by using a wire rope connected to both a housing and an enclosed electronic device. U.S. Pat. No. 8,520,390 (Okamoto et al., August 2013) disclose a design that incorporates thermal conduction and vibration damping for an electro-mechanical device using two separate materials with distinctive characteristics.

Despite heat dissipation innovations for electronic devices in general, the hard disk drive (magnetic spinning platter disk drive) is a computer component that continues to accomplish low-efficiency heat dissipation primarily by means of air circulation around the exterior of the disk drive unit. Such a hard disk drive unit is a data storage device used for storing and retrieving digital information using rapidly rotating disks (platters) coated with magnetic material. Digital information is written to and read from the rotating disks by means of a sensor on a mechanical arm that is literally flown over the surface of the disk. The atmospheric environment inside the disk drive unit is critical to the "fly-height" of the sensor. Therefore, almost all hard disk drive units are designed to allow atmospheric air to enter and leave the unit as necessary to maintain a suitable molecular composition and pressure of gas inside the disk drive unit. Because the hard disk drive units a) must remain open to the atmosphere and b) produce rotational and translational vibration that must be damped for proper operation, disk drive units commonly use air circulation around the exterior of the disk drive unit for heat dissipation. Two major exceptions to the common hard disk drive design exist in the market today—the SSD and the helium filled hard disk drive. The SSD is a "solid-state disk" that is comprised of solid state memory chips and has no moving parts. The helium filled hard disk drive unit is a hermetically sealed unit designed to internally contain a helium environment instead of atmospheric air. Examples of a helium filled hard disk drive unit are produced by HGST and Seagate. All disk drive units can benefit greatly from an improved means of heat dissipation that results in improved performance, reliability, and disk drive unit longevity. Optical platter disk drives are subject to many of the same limitations as magnetic spinning platter disk drives.

Current solutions for electronic device mounting and enclosures that combine vibration damping with heat dissipation have significant shortcomings. Typically, current solutions for electronic device mounting and enclosures are optimized for only one of a) manufacturing cost, b) thermal transfer, or c) vibration damping. The solutions that are low in manufacturing costs are typically air-cooled and result in marginal cooling and vibration damping performance. The solutions that are optimized for thermal transfer are typically constructed as custom cold-plate designs with tight tolerances and complex cooling piping that result in higher manufacturing costs, higher system maintenance costs, and lower vibration damping. The solutions that are optimized for vibration damping are typically air-cooled and require moderately complex structural elements resulting in marginal cooling performance, larger overall unit sizes, and higher manufacturing costs. The solutions that are optimized for vibration damping and heat dissipation are typically constructed with complex structural elements resulting in larger overall unit sizes, and higher manufacturing costs, and higher system maintenance costs. For example, the heat-conducting wire rope solution of U.S. Pat. No. 6,151,216 requires attachment points for the wire rope on both the exterior casing or chassis and the electronic device itself. A failure of either attachment point, or a fatigue failure of the wire rope itself after prolonged exposure to small-scale vibrations, causes loss of both heat conduction and vibration damping functionality.

Thermally conductive plastics and elastomers are newer marketplace innovations that enable excellent thermal conduction, mechanical strength, and vibration damping properties in a single material and are useful for such applications as heat exchangers, heat sinks, enclosures, and electronics substrates and packaging. Two examples of potential commercial applications of thermally conductive plastics are disclosed in U.S. Patent Application US20100012354 A1 (2009), in which Hedin and Miller describe a printed circuit board contains a thermally conductive dielectric layer; and Patent Application WO2013171483 A1 (2012), in which Lee and Laverick disclose a vessel of thermally conductive plastic for freeze-drying.

The inventions disclosed herein overcome many of the shortcomings of prior art in relation to the heat dissipation and vibration damping of electronic devices. Thermally conductive polymers enable significant design improvements as disclosed herein. In particular, mounting assemblies can be constructed using thermally conductive polymers with low cost manufacturing techniques that create assemblies that are in contact with and interposed between the electronic device to be cooled and the supporting structure for the electronic device. This contact type of assembly transmits heat as much as one hundred times more efficiently than air while at the same time effectively absorbing vibrations and shock that would normally act on the electronic device or be passed on to the supporting structure. This is a significant improvement on current processes, eliminating or greatly reducing the requirement for inefficient air exchange cooling and thereby enabling the installation of electronic devices in a sealed enclosure. These improvements result in lower manufacturing costs as well as electronic device performance improvements that include longer life, higher reliability, and lower maintenance. Further, this is an enabling improvement for the systems in which the devices are installed resulting in higher system density designs, smaller system size, lower manufacturing costs, higher environmental tolerances, lower maintenance costs, more flexibility in installation locations, better control of system heat dissipation, lower operational noise, and much higher physical, electrical, and magnetic system security.

BRIEF DESCRIPTION OF THE INVENTION

Various embodiments of a system and method for heat dissipation and vibration damping assembly for electronic devices are disclosed herein.

At least one embodiment described herein provides a heat dissipation and a vibration damping assembly for electronic devices, such assembly formed by one or more surfaces that are comprised of thermally conductive plastic ("Plastic Device Mounting Assembly") that combine to partially or completely enclose one or more electronic devices as a physical and thermal intermediary between an electronic device and supporting structure(s) for the electronic device. Such embodiments are optimized for direct and indirect transfer of thermal energy away from heat-generating electronics into the surrounding supporting structures, enclosures, and ultimately into a local or remote environment. Further, such embodiments include the mitigation of vibrations and/or shock that act on the electronic device or are created by the electronic device.

Embodiments of the Plastic Device Mounting Assembly have varied dimensional and physical characteristics that may lead to various descriptions of the Plastic Device Mounting Assembly that include, but are not limited to, vessel, canister, container, fixture, enclosure, wrapper, holder, caddy, case, drawer, rail, cap, glove, grommet, or jacket. The Plastic Device Mounting Assembly may be comprised of one or more components that combine to form a whole unit, an example of which is a clamshell type embodiment in which the Plastic Device Mounting Assembly has a top section and a bottom section that fit in close proximity to form a single Plastic Device Mounting Assembly.

Multiple configuration options are described to optimize the use of Plastic Device Mounting Assemblies. The installation can be in any orientation and can be used as a standalone assembly or as a component of other assemblies. Plastic Device Mounting Assemblies may be configured as single units or may be stacked or grouped together to form a structural unit of any dimensionality in a high-density configuration. The disclosed design leads to cooler operation, reduced vibration, longer life, higher reliability, and lower maintenance of electronic devices.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGS and detailed description. It is intended that all such additional systems, methods, features and advantages that are included within this description, be within the scope of the claims.

BRIEF DESCRIPTION OF FIGURES

The features characteristic of the invention are set forth in the claims. However, the invention itself and further objectives and advantages thereof, will best be understood by reference to the following detailed description when read in conjunction with the accompanying drawings in which the left-most significant digit(s) in the reference numerals denote(s) the first figure in which the respective reference numerals appear, wherein:

DETAILED DESCRIPTION

Although described with reference to certain embodiments, those with skill in the art will recognize that the disclosed embodiments have relevance to a wide variety of areas in addition to those specific examples described below. Further, elements from one or more embodiments may be used in other embodiments and elements may be removed from an embodiment and remain within the scope of this disclosure.

All references, including publications, patent applications, and patents, cited herein are hereby incorporated by reference to the same extent as if each reference were individually and specifically indicated to be incorporated by reference and were set forth in its entirety herein; provided, however, to the extent there exists a conflict between this disclosure and a document incorporated by reference, this disclosure shall control.

As referenced herein, the terms "thermally conductive plastic", "thermally conductive and vibration damping plastic", "thermally conductive elastomer", "thermally conductive viscoelastic", and "thermally conductive polymer" are used interchangeably.

As referenced herein, vibration is defined as movement of an electronic device in any X, Y, Z plane that is a result of a rotational, translational, oscillating, vibratory, shock, or other kinetic forces.

As referenced herein, vibrational forces are forces to which an electronic device is subject as a result of vibration.

As referenced herein, vibration damping is the attempt to minimize or eliminate vibrational forces that act on an electronic device and/or the transmission of said vibrational forces to or from associated or adjacent objects such as structures, enclosures, or other devices.

As referenced herein, interpose is defined as disposing an object to be or come between at least two other objects.

Figure 1:
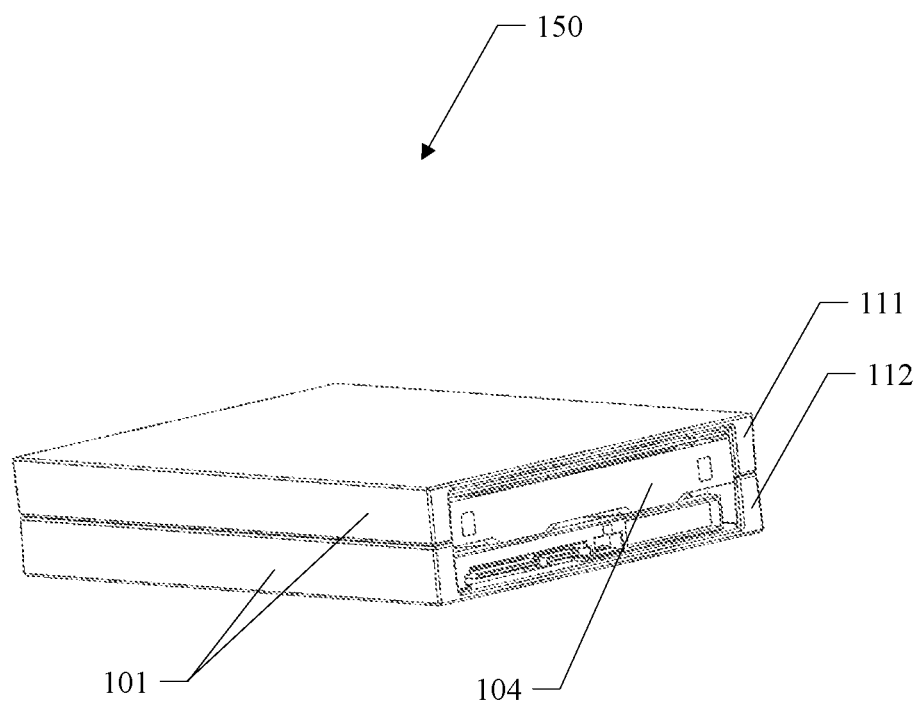
FIG. 1 shows a conceptual view of a heat dissipation and a vibration damping assembly for at least one electronic device formed by one or more surfaces that are comprised of thermally conductive plastic according to an embodiment of the disclosed subject matter.

FIG. 1 shows a conceptual view of a heat dissipation and a vibration damping assembly 150 for at least one electronic device 104, said assembly 150 formed by one or more surfaces that are comprised of thermally conductive plastic ("Plastic Device Mounting Assembly") that combine to partially or completely enclose or surround said at least one electronic device 104 as a physical and thermal intermediary between said at least one electronic device 104 and supporting structures associated with said at least electronic device 104. The Plastic Device Mounting Assembly 101, also known as a "thermally conductive and vibration damping plastic structure", is comprised of thermally conducting plastic configured as one or more associated components.

The electronic device 104 is any type of heat-generating electronic device, including but not limited to, a circuit board, motherboard, computing unit, hard disk drive (magnetic spinning platter disk drive), optical disk drive (optical spinning platter disk drive), solid state drive, electronic memory, electronic component, or electronic assembly. Further, such an electronic device 104 may have operational kinetic processes that result in vibration. The Plastic Device Mounting Assembly 101 is optimized for direct and indirect transfer of thermal energy away from electronic devices 104 into the surrounding supporting structure, enclosures, and ultimately into a local or remote environment. Further, such embodiments include vibration damping of electronic devices 104 in order mitigate the amount of vibrations and shock that would normally act on the electronic device 104 or be passed to or from the supporting structure of the electronic device 104.

Embodiments of the Plastic Device Mounting Assembly 101 have varied dimensional and physical characteristics that may lead to various descriptions of the Plastic Device Mounting Assembly 101 that include, but are not limited to, vessel, canister, container, fixture, enclosure, wrapper, holder, caddy, case, drawer, rail, cap, glove, grommet, or jacket. The Plastic Device Mounting Assembly 101 may be comprised of one or more components that combine to form a whole unit, an example of which is disclosed herein in which the Plastic Device Mounting Assembly 101 has a top section 111 and a bottom section 112 that fit in close proximity to the electronic device 104 to form a single Plastic Device Mounting Assembly 101. Additional embodiments of a Plastic Device Mounting Assembly 101 are disclosed in FIGS. 2, 3.

Embodiments of the Plastic Device Mounting Assembly 101 are comprised of varied material construction in which the Plastic Device Mounting Assembly 101 a) is comprised of a homogeneous thermally conductive and vibration damping material interposed between the electronic device 104 and supporting structures associated with the electronic device 104, or b) is comprised of a plurality of materials wherein at least one of the plurality of materials is i) both thermally conductive and vibration damping and ii) interposed between the electronic device 104 and supporting structures associated with the electronic device 104.

A Plastic Device Mounting Assembly 101 is interposed between an electronic device 104 and the supporting structure for said electronic device 104 and functions as a thermal and physical intermediary between said electronic device 104 and said supporting structure for said electronic device 104. The amount of surface area of Plastic Device Mounting Assembly 101 that is in contact with an electronic device 104 may vary and is dependent on the thermal and vibrational operational characteristic of the electronic device 104. The amount of surface area of Plastic Device Mounting Assembly 101 that is in contact with the supporting structure associated with an electronic device 104 may vary and is dependent on the thermal and vibrational operational characteristic of said supporting structure and said associated electronic device 104.

A supporting structure is any structural component that is located outside the region occupied by a Plastic Device Mounting Assembly 101 and the electronic device 104 associated with said Plastic Device Mounting Assembly 101 and serves a variety of functions some of which are a) the mechanical constraint of a Plastic Device Mounting Assembly 101, b) to transport heat that originates in an electronic device 104 and flows through an associated Plastic Device Mounting Assembly 101 into said supporting structure, c) to allow serviceable replacement of said Plastic Device Mounting Assembly 101 and the associated electronic device 104, and d) to create a unit comprised of a plurality of Plastic Device Mounting Assembly 101 and associated electronic devices 104. A supporting structure may be constructed of any thermally conductive material with suitable structural properties. A supporting structure may be comprised of one or more components such that a reference herein to "supporting structures" has the same meaning as "supporting structure". One embodiment of a supporting structure creates a compression interface between the supporting structure, Plastic Device Mounting Assembly 101, and associated electronic device 104. In another embodiment, the supporting structure, Plastic Device Mounting Assembly 101, and associated electronic device 104 are attached together by mechanical or chemical means that comprise screws, bolts, pins, clamps, slides, sockets, brackets, rivets, adhesives, locking/clipping structures, connection fingers, adhesives, thermal pastes, thermal pads, and thermal epoxies. However, the specific design and configuration of a supporting structure is dependent on a) each specific electronic device 104 and associated Plastic Device Mounting Assembly 101, and b) the overall system into which said electronic device 104 and associated Plastic Device Mounting Assembly 101 is disposed. Embodiments of supporting structures are disclosed in FIGS. 4, 5.

A Plastic Device Mounting Assembly 101 may have design features that enhance the ability of a Plastic Device Mounting Assembly 101 to physically maintain contact with an associated electronic device 104 such as holes, slots, tabs, rails, inserts, studs, dowels, keyholes, and keyways. A Plastic Device Mounting Assembly 101 may have design features that enhance the ability of a Plastic Device Mounting Assembly 101 to physically maintain contact with an associated supporting structure such as holes, slots, tabs, rails, inserts, studs, dowels, keyholes, and keyways. A Plastic Device Mounting Assembly 101 may be a) physically connected to an associated electronic device 104 by mechanical or chemical means that comprise screws, bolts, pins, clamps, slides, sockets, brackets, rivets, adhesives, locking/clipping structures, connection fingers, adhesives, thermal pastes, thermal pads, and thermal epoxies, b) physically connected to an associated supporting structure by mechanical or chemical means that comprise screws, bolts, pins, clamps, slides, sockets, brackets, rivets, adhesives, locking/clipping structures, connection fingers, adhesives, thermal pastes, thermal pads, and thermal epoxies, or c) physically connected to both an associated electronic device 104 and an associated supporting structure by mechanical or chemical means that comprise screws, bolts, pins, clamps, slides, sockets, brackets, rivets, adhesives, locking/clipping structures, connection fingers, adhesives, thermal pastes, thermal pads, and thermal epoxies. The electronic device 104 is not directly physically connected to an associated supporting structure except when as determined by design, an embodiment may exist in which said electronic device 104 may be directly connected to said associated supporting structure such that vibrational forces are sufficiently damped by the Plastic Device Mounting Assembly 101 that is disposed between said electronic device 104 and said associated supporting structure.

A Plastic Device Mounting Assembly 101 has a dimensionality that forms a reflected image of at least a portion of the surface of an electronic device 104 such that said reflected image comprises at least one of the following configurations in which a) portions of said reflected image are in direct thermal contact with said surface of said electronic device 104, b) portions of said reflected image are in indirect thermal contact with said surface of said electronic device 104 having thermal interface materials disposed between said portions of said reflected image and said surface of said electronic device 104, c) portions of said reflected image are in direct mechanical contact with said surface of said electronic device 104, d) portions of said reflected image have a designated gap that exists between said reflected image and said surface of said electronic device 104, and e) portions of said reflected image protrude above the predominate surface of said reflected image in forms that comprise constructions described as ribs, truncated spheres, or fins, said constructions in direct mechanical contact with said surface of said electronic device 104.

A Plastic Device Mounting Assembly 101 is configured with a dimensionality that provides advantageous thermal functionality for the associated electronic device 104. Examples of said advantageous thermal functionality of a Plastic Device Mounting Assembly 101 comprise a) dielectric thermally conductive plastic surfaces that are configured to be in thermal contact with high heat output electronic components such as chip packages, processors, FGPA, MOSFET, power components, solid state memory, and solid state drives, b) thermally conductive plastic surfaces that are configured to be in thermal contact with a thermally conductive structural portion of the electronic device 104 such as the aluminum casing of a hard disk drive, c) thermally conductive plastic surfaces that are configured to be in thermal contact with a thermally conductive heat pipe, heat sink, or heat spreader that is affixed to the electronic device 104 or a component of the electronic device 104, d) dielectric thermally conductive plastic surfaces that are configured to be in thermal contact with larger areas of component filled surfaces of an electronic device 104, and e) dielectric thermally conductive plastic surfaces that are configured to be in thermal contact with areas of an electronic device 104 that are uneven or difficult to contact such as the back or solder side of an electronic component circuit board.

A Plastic Device Mounting Assembly 101 may be configured with a dimensionality that provides advantageous vibrational damping functionality for the associated electronic device 104 by configurations that comprise a) thermally conductive plastic surfaces with vibration damping qualities suitable for a particular electronic device 104, b) contact with the electronic device 104 at corners, surfaces, sides, or components where vibrational forces to be damped are present, c) a particular dimensionality that damps the undesirable vibrational forces at a particular location without amplifying other vibrational forces at said location, d) a damping capability that is designed to mitigate the operational vibrational forces of the electronic device 104 that are transmitted to any associated supporting structure, and e) a damping capability that is designed to mitigate impulse or shock forces that are transmitted to the electronic device 104 from an associated supporting structure.

A Plastic Device Mounting Assembly 101 has a dimensionality that forms a reflected image of at least a portion of the surface of the supporting structure such that said reflected image comprise at least one the following configurations in which a) portions of said reflected image are in direct thermal contact with said surface of said supporting structure, b) portions of said reflected image are in indirect thermal contact with said surface of said supporting structure having thermal interface materials disposed between said portions of said reflected image and said surface of said supporting structure, c) portions of said reflected image are in direct mechanical contact with said surface of said supporting structure, and d) portions of said reflected image have a designated gap that exists between said reflected image and said surface of said supporting structure, and e) portions of said reflected image protrude above the predominate surface of said reflected image in forms that comprise constructions described as ribs, truncated spheres, or fins, said constructions in direct mechanical contact with said surface of said supporting structure.

The Plastic Device Mounting Assembly 101 is comprised of a material known herein as "thermally conducting plastic" that comprises properties as follows: a) a polymer with any combination of thermoplastic, elastomeric, and viscoelastomeric properties, b) electrically conducting or electrically insulating, c) enhanced thermal conduction typically accomplished by adding particles of thermally conducting materials that are distributed throughout the polymer matrix, d) a minimum thermal conductivity of about 1.0 watts per meter-Kelvin (W/mK), e) resilience to deform elastically to provide a measure of vibration damping between an electronic device 104 and an associated supporting structure, and f) a Shore A hardness of less than 60.

The polymer matrix of the thermally conducting plastic may comprise a wide range of polymeric materials comprising polypropylene, polyethylene (including high and low-density polyethylene as well as derivatives such as polyethylene terephthalate and polytetrafluoroethylene) polyester, polyacrylate, polystyrene, polyamide, polycarbonate, polyphthalamide, polyphenylene sulfide and polyvinyl polymers such as polyvinylchloride and nylon, as well as co-polymers containing these such as acrylonitrile-butadiene-styrene. The particles of thermally conducting material that may be present within the polymeric matrix may be selected from a wide range of materials comprising metals such as aluminum, nickel, gold or silver or alloys containing these or other alloys such as brass or stainless steel, metal or metalloid salts such as boron nitride, boron carbide, alumina, aluminum nitride, aluminum oxide, magnesium oxide, titanium oxide, iron oxide, tin oxide, beryllium oxide, zinc oxide, and calcium carbonate, carbon based materials such as graphite, carbon in the form of graphene, carbon nanotubes, or fullerenes, carbon in the form of carbon fiber, powder or flake, acetylene black or carbon black, as well as other materials such as glass or ceramics or mixtures or combinations of these. The particles may take the form of fibers, flakes, powders, whiskers or microspheres.

Thermally conducting plastics are characterized by various properties such as thermal conductivity, thermal diffusivity, elasticity, resilience, hardness, and chemical compatibility that are considered when selecting the optimal material composition for an embodiment. Thermally conducting plastics in various compositions and configurations are commercially available from companies such as Celanese, PolyOne, Berquist, Henkel, RTP, and Dow Corning.

Heat that is generated by an electronic device 104 is transported into a Plastic Device Mounting Assembly 101 which in turn is thermally connected to and transports heat to a region exterior to the Plastic Device Mounting Assembly 101 such as supporting structures, cooling plates, air cooling apparatus, fluid cooling apparatus, immersion single or multi-phase fluid cooling apparatus, and/or enclosing cases which serve to reject the heat into a local or remote environment via heat exchange systems. The thermal connection between an electronic device 104, the Plastic Device Mounting Assembly 101, the supporting structure and any other thermally connected components in the system may be comprised of direct physical contact or an indirect physical connection in which thermally conductive pastes, pads, epoxies, fluids, or other materials are positioned between or adjacent to contacting surfaces of the electronic device 104, the Plastic Device Mounting Assembly 101, the supporting structure and any other thermally connected components in order to facilitate optimal thermal transfer.

A Plastic Device Mounting Assembly 101 can be installed in any orientation and can be used as a standalone assembly or as a component of other assemblies. Plastic Device Mounting Assemblies 101 may be configured as single units or may be stacked or grouped together to form a structural unit of any dimensionality in a high-density configuration.

Figure 2:
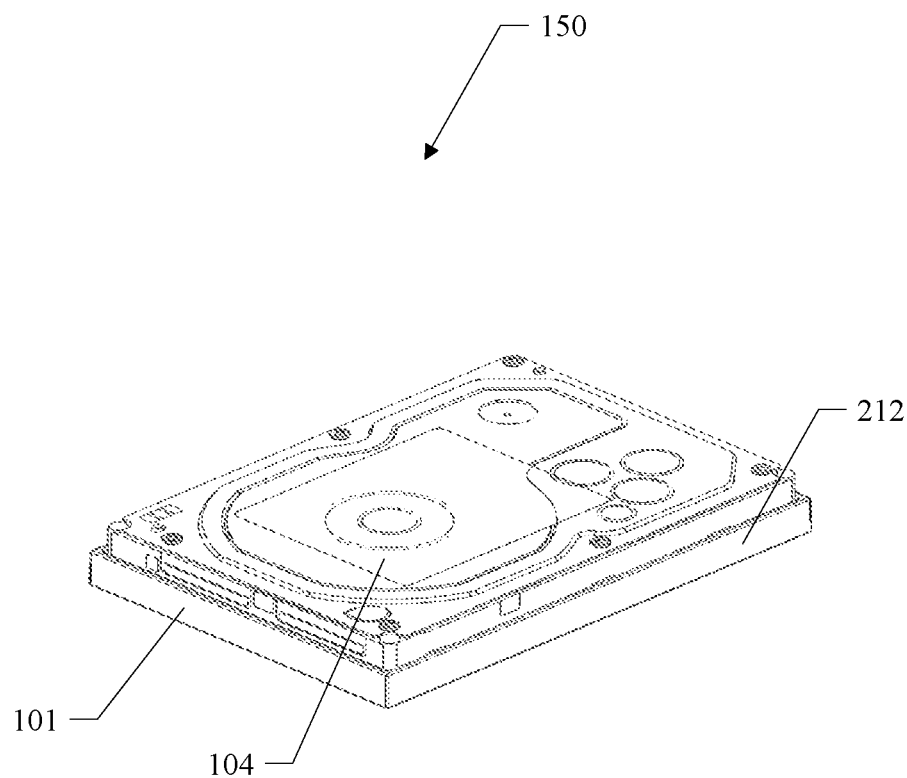
FIG. 2 shows an additional embodiment of the heat dissipation and a vibration damping assembly of FIG. 1.

FIG. 2 shows a conceptual view of a heat dissipation and a vibration damping assembly 150 that is an additional embodiment of the disclosures described in FIG. 1. As illustrated in this embodiment, the Plastic Device Mounting Assembly 101 may be comprised of a component that has a single section 212 that fits in close proximity to the electronic device 104. The Plastic Device Mounting Assembly 101 with a single section 212 and the electronic device 104 have the same characteristics and functionality as disclosed in FIG. 1.

Figure 3:
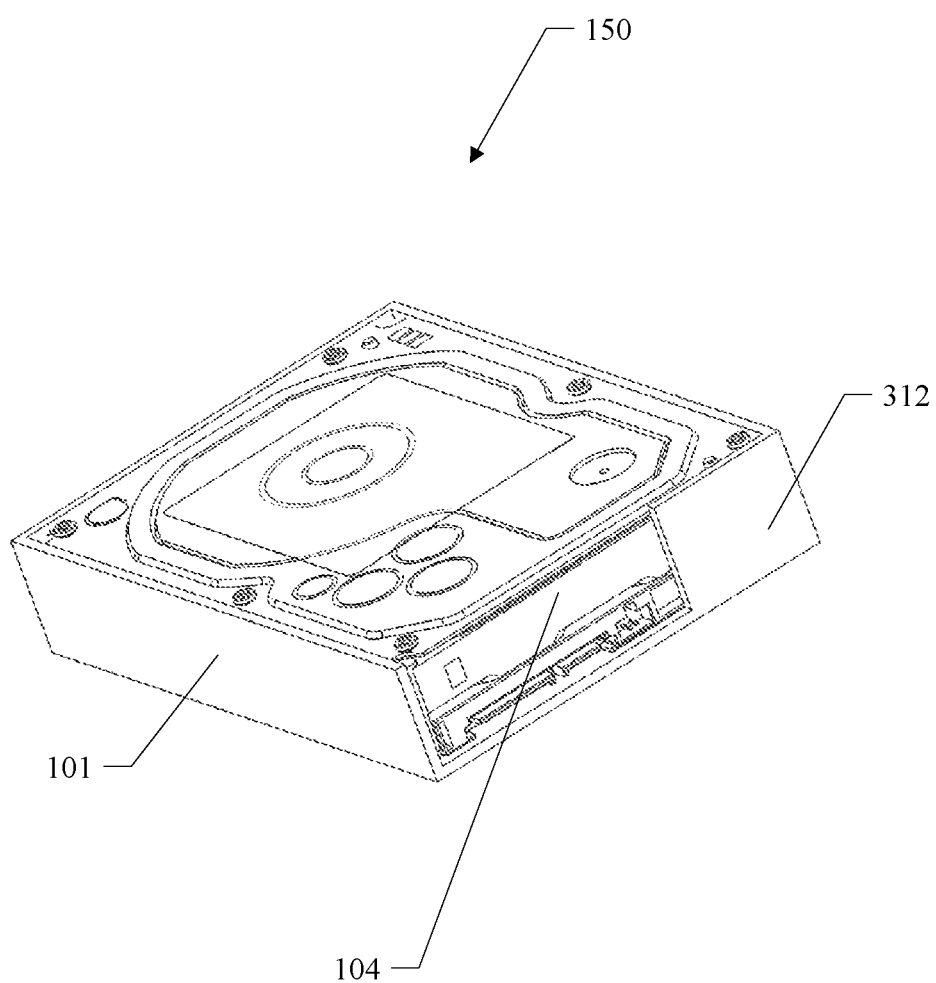
FIG. 3 shows an additional embodiment of the heat dissipation and a vibration damping assembly of FIG. 1.

FIG. 3 shows a conceptual view of a heat dissipation and a vibration damping assembly 150 that is an additional embodiment of the disclosures described in FIG. 1. As illustrated in this embodiment, the Plastic Device Mounting Assembly 101 may be comprised of a component that has a single section 312 that fits in close proximity to the electronic device 104. The Plastic Device Mounting Assembly 101 with a single section 312 and the electronic device 104 have the same characteristics and functionality as disclosed in FIG. 1.

Figure 4:
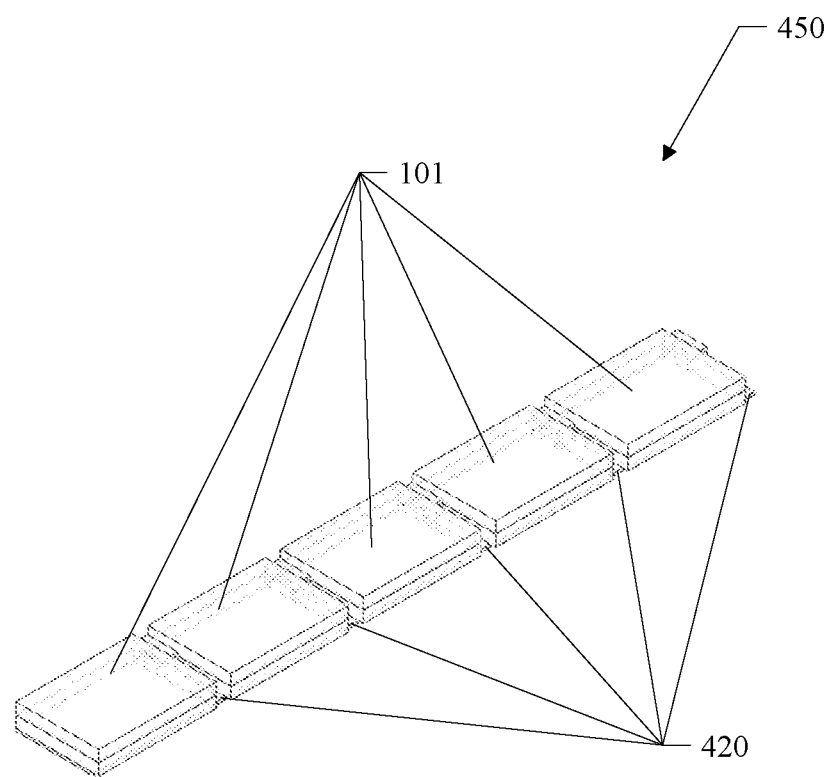
FIG. 4 shows a conceptual view of a collection of Plastic Device Mounting Assemblies attached to a supporting structure according to an embodiment of the disclosed subject matter.

FIG. 4 shows a conceptual view of an assembly 450 of Plastic Device Mounting Assemblies 101 attached to a supporting structure 420. Plastic Device Mounting Assemblies 101 and associated electronic devices 104 are attached to a supporting structure as illustrated by supporting structure 420 with the characteristics and functions referenced by the disclosures in FIG. 1. Any number of Plastic Device Mounting Assemblies 101 and associated electronic devices 104 may be grouped together and attached to supporting structure 420 to form an assembly 450 of any dimensionality. Multiple instances of assembly 450 comprising supporting structures 420, Plastic Device Mounting Assemblies 101 and the associated electronic devices 104 may be collected together and attached to other supporting structures as part of a larger functioning unit.

Figure 5:
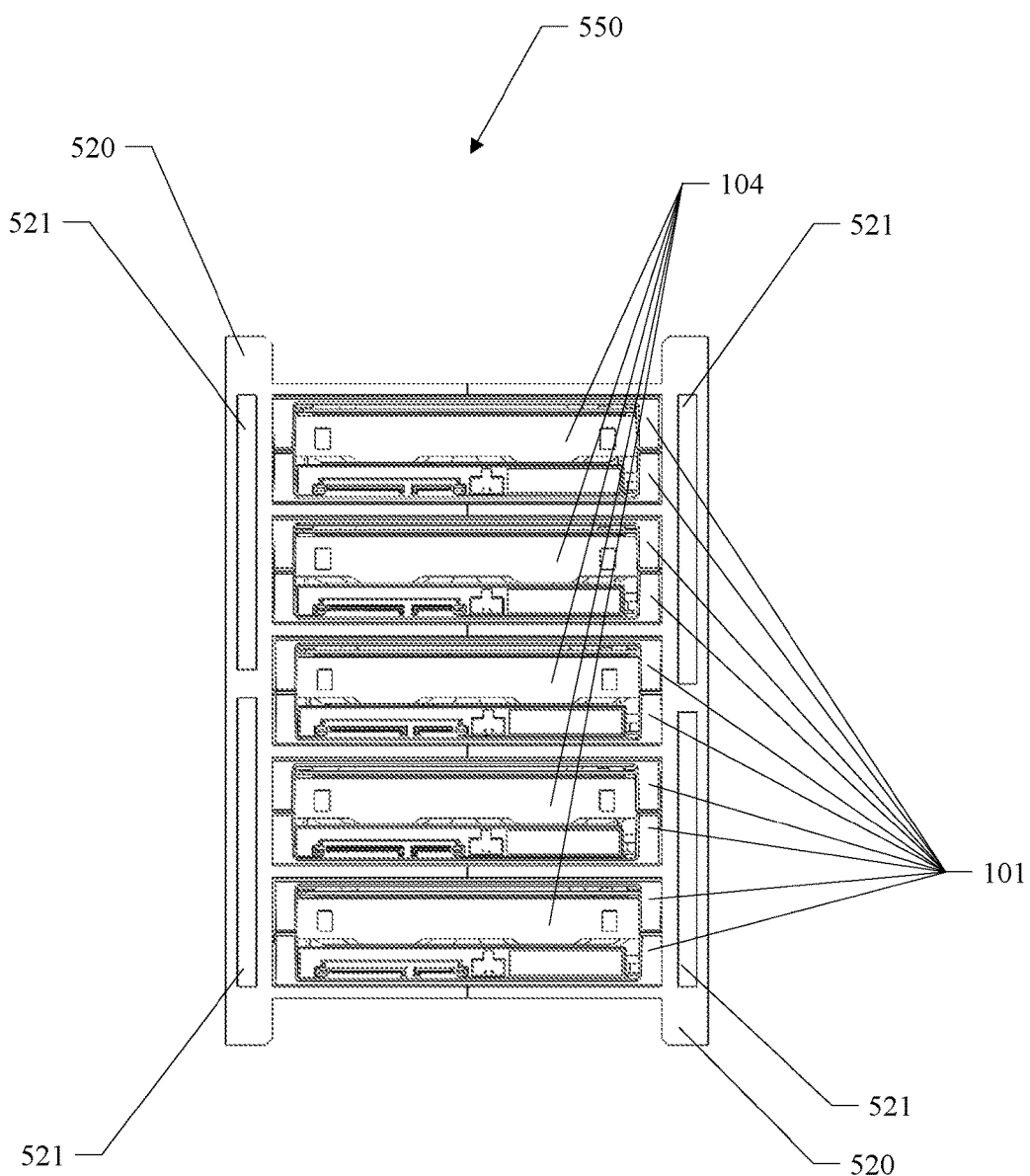
FIG. 5 shows a conceptual view of a collection of Plastic Device Mounting Assemblies attached within a supporting structure according to an embodiment of the disclosed subject matter.

FIG. 5 shows a conceptual view of an assembly 550 of Plastic Device Mounting Assemblies 101 attached within a supporting structure 520. Plastic Device Mounting Assemblies 101 and associated electronic devices 104 are attached within a supporting structure as illustrated by supporting structure 520 with the characteristics and functions referenced by the disclosures in FIG. 1. Any number of Plastic Device Mounting Assemblies 101 and associated electronic devices 104 may be grouped together and attached within supporting structure 520 to form an assembly 550 of any dimensionality. Multiple instances of assembly 550 comprising supporting structures 520, Plastic Device Mounting Assemblies 101 and the associated electronic devices 104 may be collected together and attached to other supporting structures as part of a larger functioning unit. The supporting structure 520 may optionally contain fluid channels 521 that serve as a heat exchange mechanism to facilitate the removal of heat from supporting structure 520 that is absorbed by supporting structure 520 from Plastic Device Mounting Assemblies 101 and the associated electronic device 104.

Figure 6:
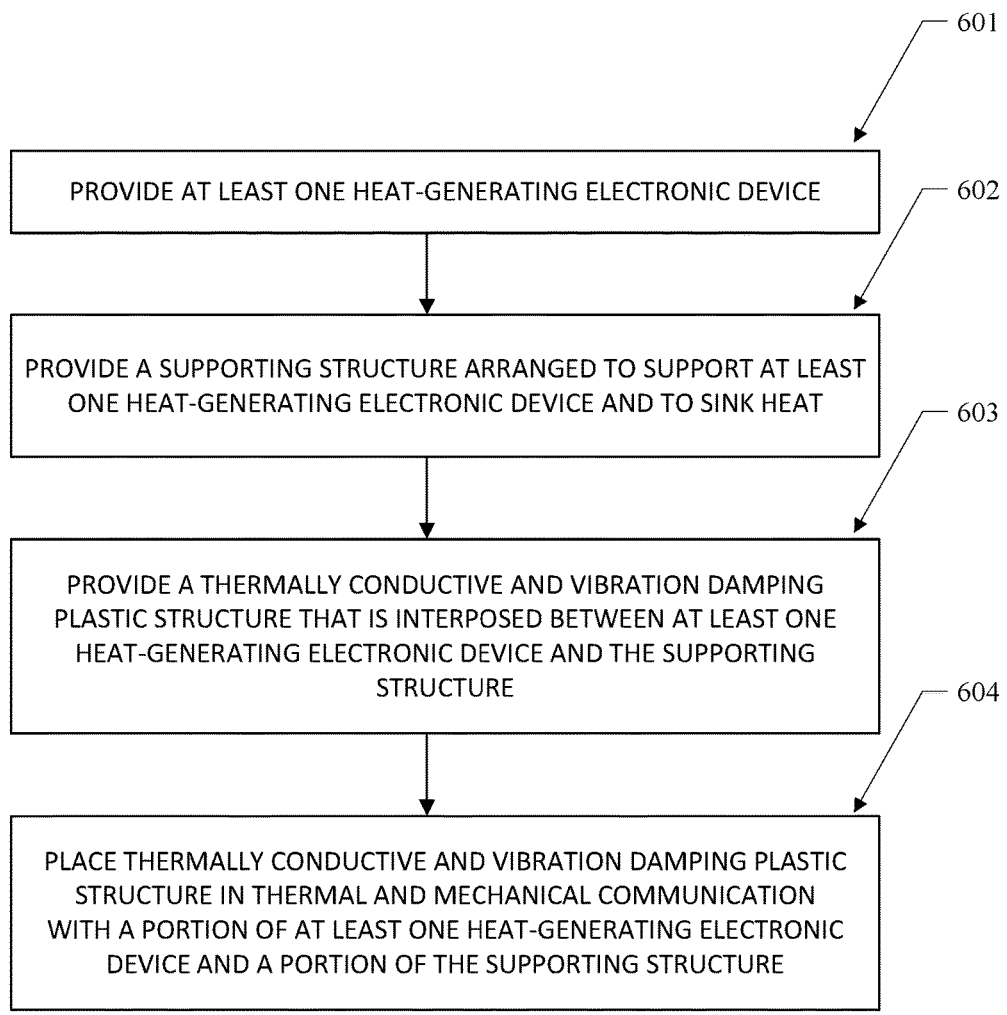
FIG. 6 is a flow diagram of an example technique for forming a heat dissipation and a vibration damping assembly that includes a thermally conductive and vibration damping plastic structure between an electronic device and a supporting structure.

FIG. 6 is a flow diagram of an example technique for forming a heat dissipation and a vibration damping assembly 150 that comprises a thermally conductive and vibration damping plastic structure interposed between an electronic device and a supporting structure.

In stage 601, at least one electronic device 104 is provided.

In stage 602, a supporting structure is provided that is arranged to mechanically support at least one electronic device 104, 601 and further arranged to transport and sink heat that originates from the at least one electronic device 104, 601.

In stage 603, a Plastic Device Mounting Assembly 101, also known as a "thermally conductive and vibration damping plastic structure" 603, is provided and comprised of thermally conducting plastic configured as one or more components. The Plastic Device Mounting Assembly 101 is interposed between the at least one electronic device 104, 601 and the supporting structure 602 and functions as a thermal and physical intermediary between the at least one electronic device 104, 601 and the supporting structure 602. The Plastic Device Mounting Assembly 101 is configured by both design and composition to provide heat dissipation and a vibration damping to the at least one electronic device 104, 601. Optionally, the Plastic Device Mounting Assembly 101 may comprise a thermally conductive material having a minimum thermal conductivity of about 1.0 watts per meter-Kelvin (W/mK). Optionally, the Plastic Device Mounting Assembly 101 may comprise a material that has a Shore A hardness of less than about 60. Optionally, the Plastic Device Mounting Assembly 101 may substantially enclose the at least one heat-generating electronic device 104, 601. Optionally, the Plastic Device Mounting Assembly 101 may be configured as a reflected image of at least a portion of the at least one heat-generating electronic device 104, 601. Optionally, the Plastic Device Mounting Assembly 101 may be configured as a reflected image of at least a portion of the supporting structure 602.

In stage 604, a Plastic Device Mounting Assembly 101, 603 is placed in thermal and mechanical communication with a portion of the at least one heat-generating electronic device 104, 601 and a portion of the supporting structure 602. In one example, the Plastic Device Mounting Assembly 101, 603 components are attached to the at least one electronic device 104, 601 by mechanical or chemical means that comprise screws, bolts, pins, clamps, slides, sockets, brackets, rivets, adhesives, locking/clipping structures, connection fingers, adhesives, thermal pastes, thermal pads, and thermal epoxies. In another example, the Plastic Device Mounting Assembly 101, 603 is configured to reflect at least a portion of the surface of the at least one electronic device 104, 601 such that the Plastic Device Mounting Assembly 101, 603 is closely fitted to the at least one electronic device 104, 601 and may require no additional fasteners or adhesives to remain in place.

The Plastic Device Mounting Assembly 101, 603 with the installed at least one electronic device 104, 601 is placed into the supporting structure 602 using any suitable technique. In one example, Plastic Device Mounting Assembly 101, 603 is attached to the at least one electronic device 104, 601 as described herein after which the Plastic Device Mounting Assembly 101, 603 with the installed at least one electronic device 104, 601 is attached in place to the supporting structure 602 by mechanical or chemical means that comprise screws, bolts, pins, clamps, slides, sockets, brackets, rivets, adhesives, locking/clipping structures, connection fingers, adhesives, thermal pastes, thermal pads, and thermal epoxies. In another example, Plastic Device Mounting Assembly 101, 603 is pre-attached to the supporting structure 602 by mechanical or chemical means that comprise screws, bolts, pins, clamps, slides, sockets, brackets, rivets, adhesives, locking/clipping structures, connection fingers, adhesives, thermal pastes, thermal pads, and thermal epoxies after which the at least one electronic device 104, 601 is attached in place to the Plastic Device Mounting Assembly 101, 603 as described herein. In another example, Plastic Device Mounting Assembly 101, 603 is attached to the at least one electronic device 104, 601 as described herein after which a temporary supporting structure is use to hold in place the Plastic Device Mounting Assembly 101, 603 with the installed at least one electronic device 104, 601 until such time that the Plastic Device Mounting Assembly 101, 603 with the installed at least one electronic device 104, 601 is attached in place to supporting structure 602 by mechanical or chemical means that comprise screws, bolts, pins, clamps, slides, sockets, brackets, rivets, adhesives, locking/clipping structures, connection fingers, adhesives, thermal pastes, thermal pads, and thermal epoxies and the temporary supporting structure is removed. In another example, the Plastic Device Mounting Assembly 101, 603 is configured to reflect at least a portion of the surface of the supporting structure 602 such that the Plastic Device Mounting Assembly 101, 603 is closely fitted to the supporting structure 602 and may require no additional fasteners or adhesives to remain in place. In another example, the Plastic Device Mounting Assembly 101, 603 with the installed at least one electronic device 104, 601 is placed into the supporting structure 602 by a suitable compression of plastic, which serves to hold in place and insure suitable mechanical and thermal communication between the Plastic Device Mounting Assembly 101, 603, the at least one electronic device 104, 601, and the supporting structure 602. The placement of the Plastic Device Mounting Assembly 101, 603 with the installed at least one electronic device 104, 601 into the supporting structure 602 may be assisted mechanically and thermally by applying any suitable pastes, greases, or lubricants to assist with the placement.

Although example diagrams to implement the elements of the disclosed subject matter have been provided, one skilled in the art, using this disclosure, could develop additional embodiments to practice the disclosed subject matter and each is intended to be included herein.

In addition to the above described embodiments, those skilled in the art will appreciate that this disclosure has application in a variety of arts and situations and this disclosure is intended to include the same.

What is claimed is:

1. A system for heat dissipation and vibration damping, said system comprising:
   at least one hard disk drive;
   a supporting structure arranged to support said at least one hard disk drive;
   a thermally conductive and vibration damping plastic structure in thermal and mechanical communication with a portion of said at least one hard disk drive and a portion of said supporting structure;
   said thermally conductive and vibration damping plastic structure comprised of one or more materials, at least one of the one or more materials comprising the property of being both thermally conductive and vibration damping interposed between said at least one hard disk drive and said supporting structure;
   said thermally conductive and vibration damping plastic structure for damping vibrations that act in at least one plane that is substantially parallel to the top and bottom of said at least one hard disk drive;
   said thermally conductive and vibration damping plastic structure interposed between said at least one hard disk drive and said supporting structure; and
   said thermally conductive and vibration damping plastic structure configured to conduct heat away from said at least one hard disk drive.

2. The system of claim 1, wherein said thermally conductive and vibration damping plastic structure further comprises a thermally conductive material having a minimum thermal conductivity of about 1.0 watts per meter-Kelvin (W/mK).

3. The system of claim 1, wherein said thermally conductive and vibration damping plastic structure further comprises a material having a Shore A hardness of less than about 60.

4. The system of claim 1, wherein said thermally conductive and vibration damping plastic structure substantially encloses said at least one hard disk drive.

5. The system of claim 1, wherein said thermally conductive and vibration damping plastic structure is configured into a reflected image of at least a portion of the surface of said at least one hard disk drive such that said reflected image is in direct contact with a portion of said surface of said at least one hard disk drive or indirect contact with a portion of said surface of said at least one hard disk drive having thermal interface materials disposed between said portions of said reflected image and said surface of said at least one hard disk drive.

6. The system of claim 1, wherein said thermally conductive and vibration damping plastic structure is configured into a reflected image of at least a portion of the surface of said supporting structure such that said reflected image is in direct contact with a portion of said surface of said supporting structure or indirect contact with a portion of said surface of said supporting structure having thermal interface materials disposed between said portions of said reflected image and said surface of said supporting structure.

7. The system of claim 1, wherein said supporting structure is configured to conduct heat away from said thermally conductive and vibration damping plastic structure.

8. The system of claim 1, wherein said supporting structure further comprises at least one fluid channel configured to conduct heat away from said thermally conductive and vibration damping plastic structure.

9. A method for heat dissipation and vibration damping, said method comprising:
   providing at least one hard disk drive;
   providing a supporting structure arranged to support said provided at least one hard disk drive;
   providing a thermally conductive and vibration damping plastic structure and placing said provided thermally conductive and vibration damping plastic structure in thermal and mechanical communication with a portion of said provided at least one hard disk drive and a portion of said provided supporting structure;
   comprising said thermally conductive and vibration damping plastic structure of one or more materials, at least one of the one or more materials comprising the property of being both thermally conductive and vibration damping interposed between said at least one hard disk drive and said supporting structure;
   configuring said thermally conductive and vibration damping plastic structure to dampen vibrations that act in at least one plane that is substantially parallel to the top and bottom of said at least one hard disk drive;
   interposing said provided thermally conductive and vibration damping plastic structure between said provided at least one hard disk drive and said provided supporting structure; and
   providing said provided thermally conductive and vibration damping plastic structure configured to conduct heat away from said provided at least one hard disk drive.

10. The method of claim 9, wherein said provided thermally conductive and vibration damping plastic structure further comprises a thermally conductive material having a minimum thermal conductivity of about 1.0 watts per meter-Kelvin (W/mK).

11. The method of claim 9, wherein said provided thermally conductive and vibration damping plastic structure further comprises a material having a Shore A hardness of less than about 60.

12. The method of claim 9, wherein said provided thermally conductive and vibration damping plastic structure substantially encloses said provided at least one hard disk drive.

13. The method of claim 9, wherein said provided thermally conductive and vibration damping plastic structure is configured into a reflected image of at least a portion of the surface of said provided at least one hard disk drive such that said reflected image is in direct contact with a portion of said surface of said provided at least one hard disk drive or indirect contact with a portion of said surface of said provided at least one hard disk drive having thermal interface materials disposed between said portions of said reflected image and said surface of said provided at least one hard disk drive.

14. The method of claim 9, wherein said provided thermally conductive and vibration damping plastic structure is configured into a reflected image of at least a portion of the surface of said provided supporting structure such that said reflected image is in direct contact with a portion of said surface of said provided supporting structure or indirect contact with a portion of said surface of said provided supporting structure having thermal interface materials disposed between said portions of said reflected image and said surface of said provided supporting structure.

15. The method of claim 9, wherein said supporting structure is configured to conduct heat away from said thermally conductive and vibration damping plastic structure.

16. The method of claim 9, wherein said supporting structure further comprises at least one fluid channel configured to conduct heat away from said thermally conductive and vibration damping plastic structure.

* * * * *